(12) United States Patent
Chen

(10) Patent No.: US 7,361,284 B2
(45) Date of Patent: Apr. 22, 2008

(54) METHOD FOR WAFER-LEVEL PACKAGE

(75) Inventor: Chih-Hsien Chen, Hsin-Chu Hsien (TW)

(73) Assignee: Touch Micro-System Technology Inc., Yang-Mei, Taoyuan Hsien (TW)

( * ) Notice: Subject to any disclaimer, the term of this patent is extended or adjusted under 35 U.S.C. 154(b) by 175 days.

(21) Appl. No.: 11/426,013

(22) Filed: Jun. 23, 2006

(65) Prior Publication Data

US 2007/0218584 A1    Sep. 20, 2007

(30) Foreign Application Priority Data

Mar. 14, 2006    (TW) .............................. 95108640 A

(51) Int. Cl.
*H01B 13/00* (2006.01)

(52) U.S. Cl. ................... 216/13; 216/17; 216/20; 216/21; 438/110; 438/113

(58) Field of Classification Search ................. 216/13, 216/17, 20, 21; 438/110, 112, 113
See application file for complete search history.

(56) References Cited

U.S. PATENT DOCUMENTS

| 6,255,741 | B1 * | 7/2001 | Yoshihara et al. ........... 257/792 |
| 7,141,870 | B2 * | 11/2006 | Yang ........................... 257/676 |
| 7,274,101 | B2 * | 9/2007 | Tomita et al. ............... 257/730 |
| 2005/0184304 | A1 * | 8/2005 | Gupta et al. .................. 257/98 |
| 2006/0197215 | A1 * | 9/2006 | Potter ........................ 257/704 |
| 2007/0176280 | A1 * | 8/2007 | Do et al. ..................... 257/692 |

* cited by examiner

*Primary Examiner*—Binh X Tran
(74) *Attorney, Agent, or Firm*—Winston Hsu

(57) ABSTRACT

A method for wafer-level package. A cap wafer having cavities is bonded to a support wafer, and a portion of the cap wafer is etched through. The cap wafer is released from the support wafer, and bonded to a transparent wafer, and a portion of the cap wafer corresponding to the cavities is removed so that the remaining cap wafer forms a plurality of support blocks. A device wafer is provided, and the support blocks are bonded to the device wafer so that the support blocks and the transparent wafer hermetically seal the devices disposed in the device wafer.

15 Claims, 22 Drawing Sheets

METHOD FOR WAFER-LEVEL PACKAGE

BACKGROUND OF THE INVENTION

1. Field of the Invention

The present invention relates to a wafer-level package method, and more particularly, to a method that enables wafer-level testing, and provides hermetical windows to devices.

2. Description of the Prior Art

The package process is an important step to the back-end process of semiconductor or MEMS manufacture, and crucial to the yield and cost.

Please refer to FIG. 1 to FIG. 4. FIG. 1 to FIG. 4 are schematic diagrams illustrating a conventional method for package. As shown in FIG. 1, a device wafer 10 is provided. The device wafer 10 includes devices 12 to be packaged, inter-connection layers (not shown), and contact pads (not shown) disposed thereon. A cutting process is then performed by a cutting apparatus to divide the device wafer 10 into a plurality of device dies 14 according to pre-defined scribe liens.

As shown in FIG. 2, a cap wafer 20 is provided, and another cutting process is performed to divide the cap wafer 20 into a plurality of protection caps 22. The size of each protection cap 22 is equal to or slightly smaller that that of each device die 14. As shown in FIG. 3, a bonding adhesive 30 e.g. a polymer adhesive is coated on the surface of the device die 14. As shown in FIG. 4, the protection cap 22 is adhered to the device die 14 with the bonding adhesive 30, and necessary clean processes are performed.

For an optical device or a MEMS device, this device requires a sensor area or an operation area, and thus a transparent hermetical window or a hermetical room has to be formed. Consequently, the device is prevented from being contaminated by air, dust or humidity. In addition, the device can be free from mechanical or radioactive influences. The hermetical room also prevents the gas leakage problem and breakage of vacuum. In fact, the quality of the hermetical room or window somehow reflects the reliability of the optical devices or MEMS devices.

The thermal stability of the polymer adhesive, however, is not good, and the reliability of the devices is therefore degraded. For the optical or MEMS devices that have high hermetical requirement, the conventional method is not adaptive. In addition, the conventional package is carried out after the device wafer is diced, thus the device die has to be packaged individually, even manually. This seriously influences the efficiency and yield of the back-end package process, and increases the cost.

SUMMARY OF THE INVENTION

It is therefore one of the objectives of the present invention to provide a method for wafer-level package to improve the yield and reliability.

According to the present invention, a method for wafer-level package is provided. First, a cap wafer is provided, and a plurality of cavities are formed in a first surface of the cap wafer. Then, the first surface of the cap wafer is bonded to a support wafer, and the cap wafer surrounding the cavities is etched through from a second surface of the cap wafer. The cap wafer is removed from the support wafer, and the first surface of the cap wafer is bonded to a transparent wafer. Subsequently, a portion of the cap wafer corresponding to the cavities is removed from the second surface of the cap wafer so that the remaining cap wafer form a plurality of support blocks. Following that, a device wafer including a plurality of devices and a plurality of contact pads is provided, and the support blocks is bonded to the device wafer so that the support blocks and the transparent wafer hermitically seal the devices.

These and other objectives of the present invention will no doubt become obvious to those of ordinary skill in the art after reading the following detailed description of the preferred embodiment that is illustrated in the various figures and drawings.

DETAILED DESCRIPTION

Figure 5:
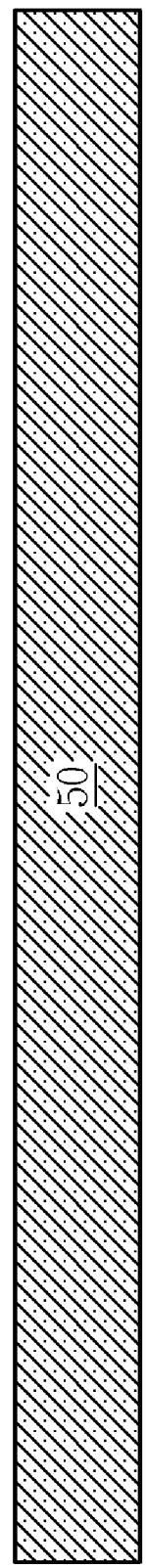
FIG. 5 to FIG. 22 are schematic diagrams illustrating a method for wafer-level package according to a preferred embodiment of the present invention.
Figure 6:
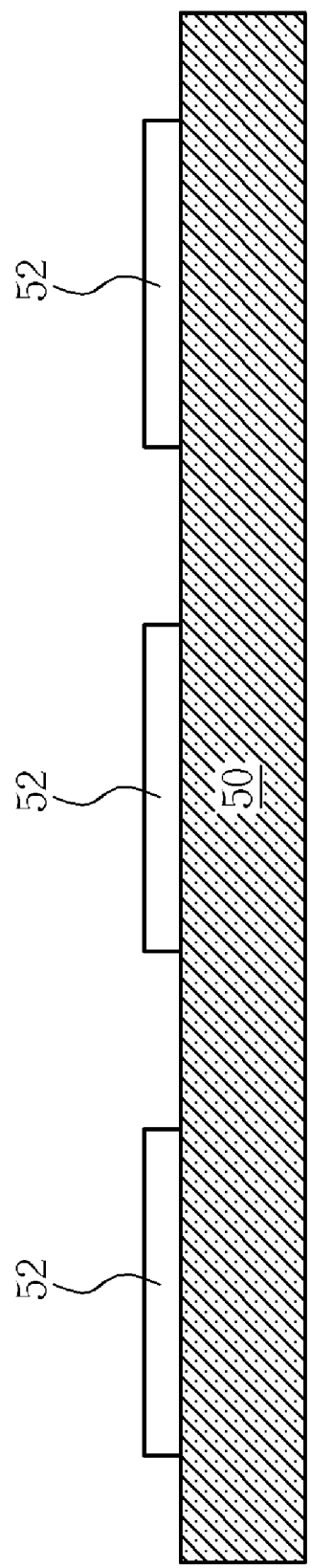
Figure 7:
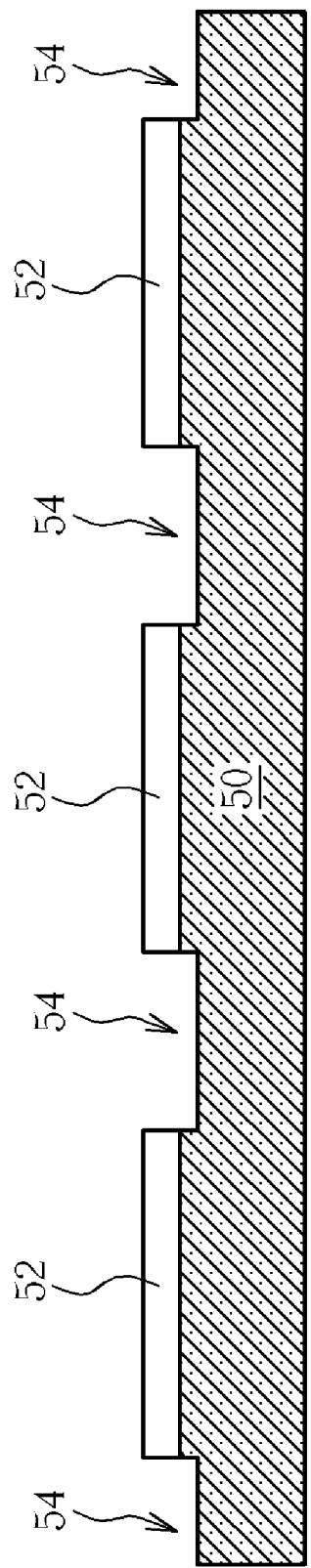

Please refer to FIG. 5 to FIG. 22. FIG. 5 to FIG. 22 are schematic diagrams illustrating a method for wafer-level package according to a preferred embodiment of the present invention. As shown in FIG. 5, a cap wafer 50 is provided. In this embodiment, the cap wafer 50 is a semiconductor wafer e.g. a silicon wafer, but not limited. As shown in FIG. 6, a masking pattern 52 serving as an etching mask is formed on the first surface of the cap wafer 50. The masking pattern 52 can be a photoresist pattern, a dielectric pattern, or a pattern made of other suitable materials formed by photolithographic or halftone printing techniques. As shown in FIG. 7, an etching process is performed to form a plurality of cavities 54 in the first surface of the cap wafer 50. The depth of the cavities 54 varies depending on the requirement of the hermetical room to be formed. In this embodiment, the depth of the cavities 54 is approximately between 5 and 10 micrometers, for instance. In addition, the etching process can be a dry etching process e.g. a reactive ion etching (RIE) process, or a wet etching process using an etching solution such as potassium hydroxide (KOH) solution, ethylenediamine-pyrocatechol-water (EDP) solution, or tetramethyl ammonium hydroxide (TMAH) solution.

Figure 8:
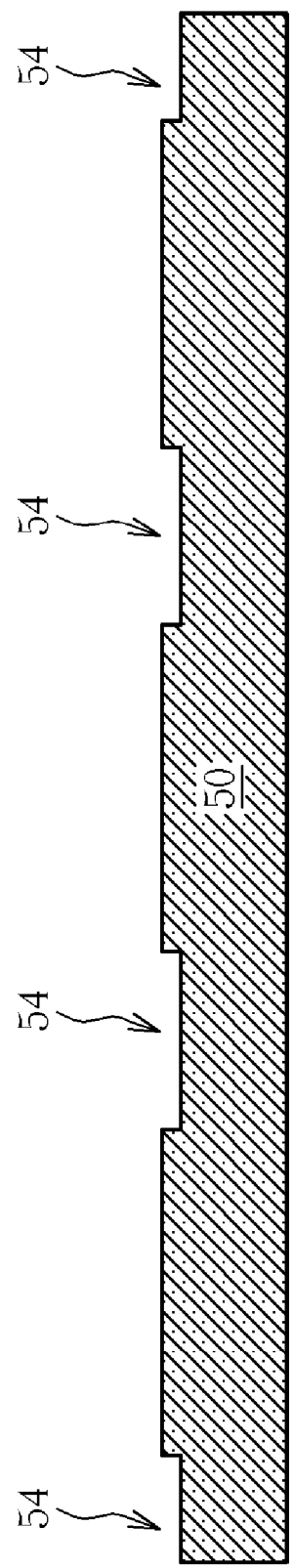
Figure 9:
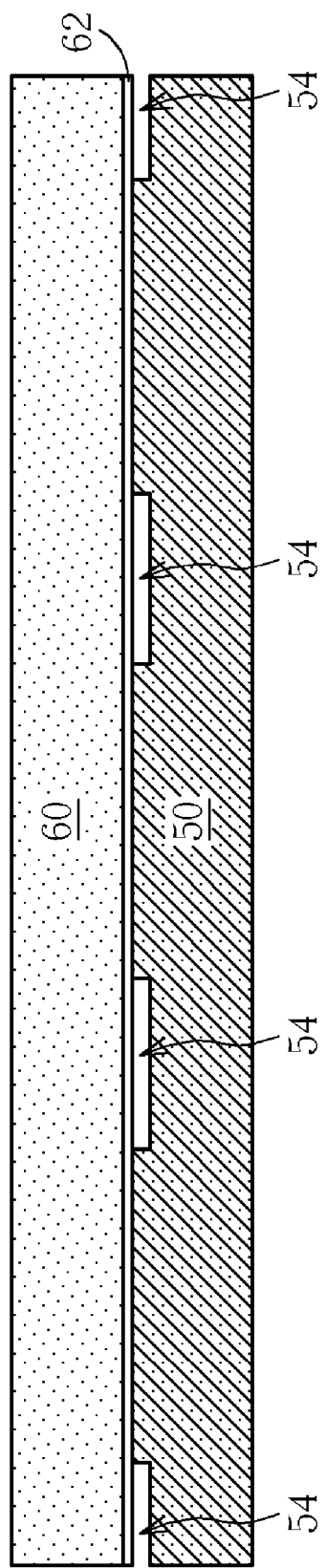

As shown in FIG. 8, the masking pattern 52 is removed. As shown in FIG. 9, a support wafer 60 is provided, and the first surface of the cap wafer 50 is bonded to the support wafer 60 with a bonding layer 62. The supports wafer 60 serves as a support carrier for the convenience of successive processes, and will be released later. Therefore, the adhesion between the support wafer 60 and the bonding layer 62 should be taken into consideration when selecting the material of the support wafer 60. If the support wafer 60 is designed to be reworkable, the release facility should be considered as well as the adhesion between the cap wafer 50 and the support wafer 60 when selecting the material of the bonding layer 62. In this embodiment, the support wafer 60 is a glass wafer, but not limited. The support wafer 60 can also be a quartz wafer, a plastic wafer, a semiconductor wafer, etc. The material of the bonding layer 62 can be photoresist, epoxy, dry film, thermal release tape, UV tape, or other suitable adhesives.

Figure 1:
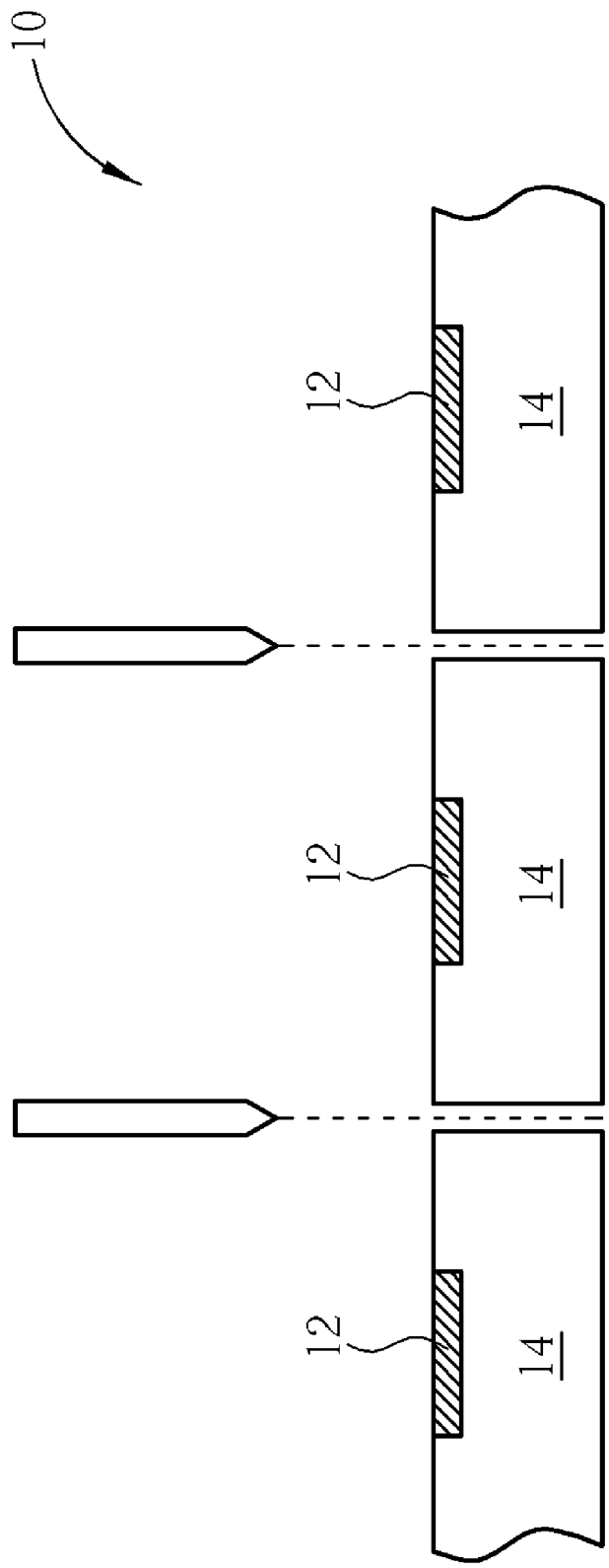
FIG. 1 to FIG. 4 are schematic diagrams illustrating a conventional method for package.
Figure 2:
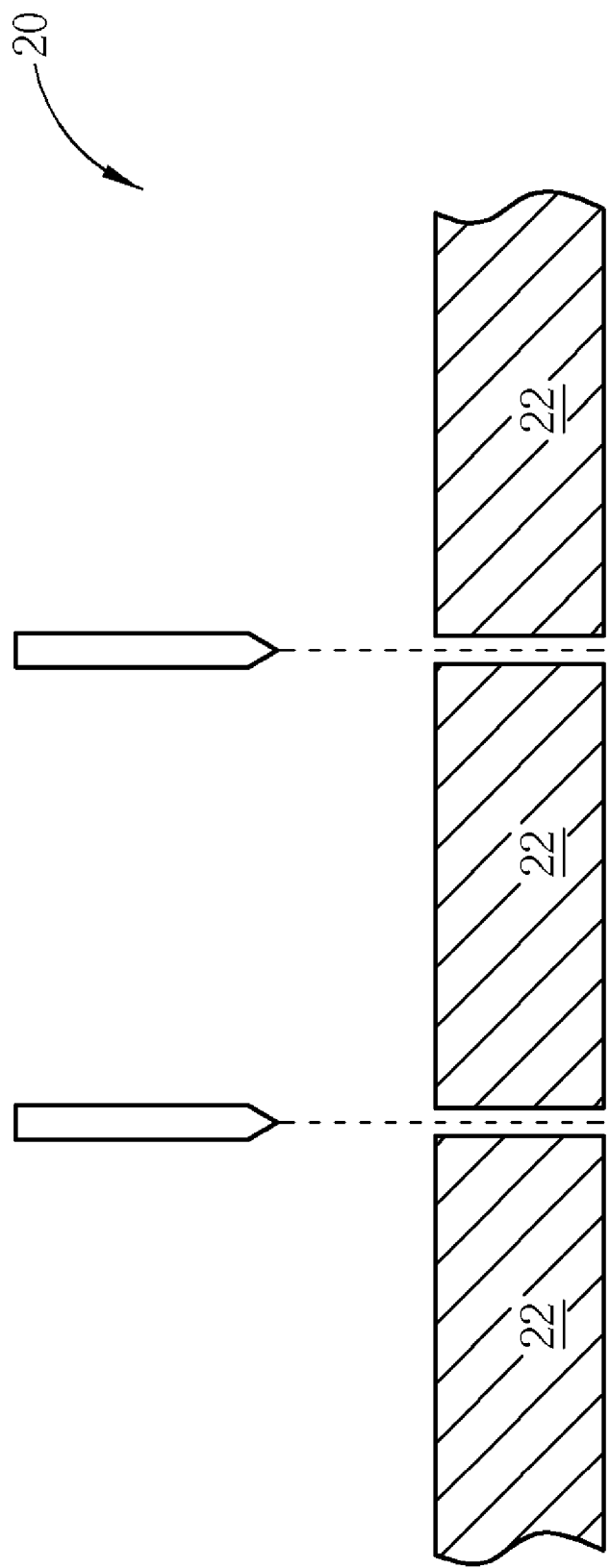
Figure 3:
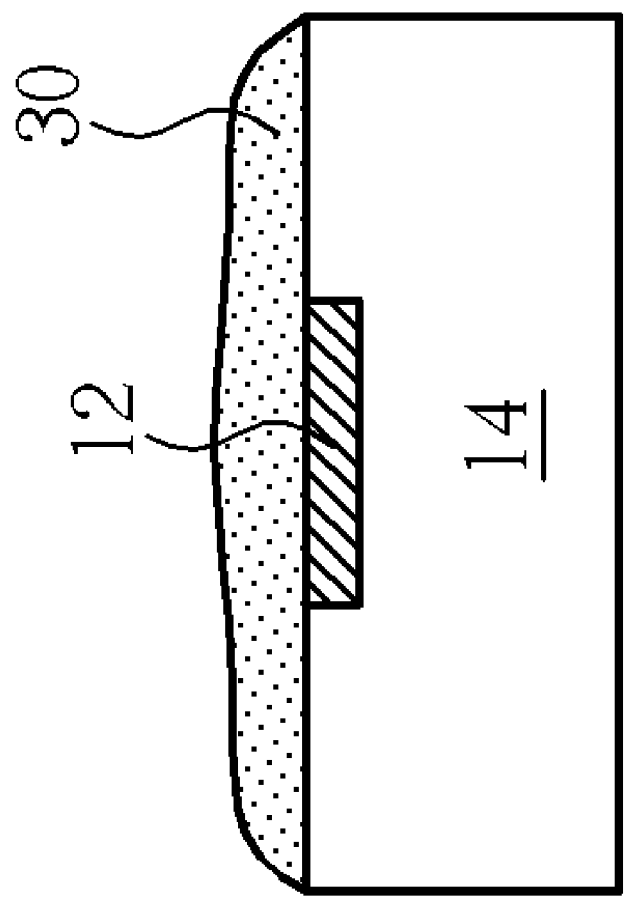
Figure 4:
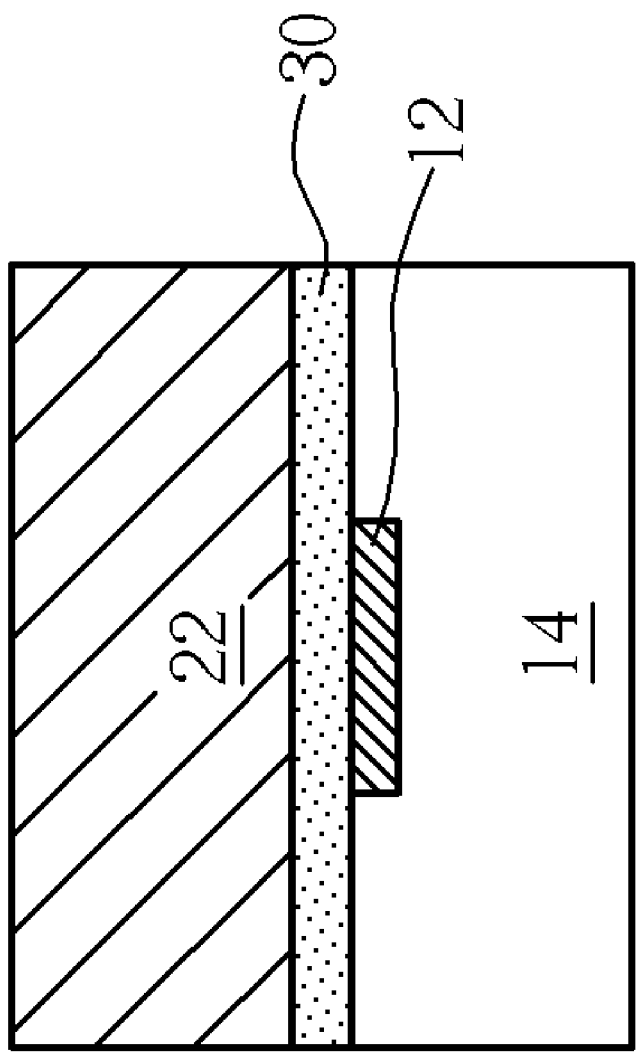
Figure 10:
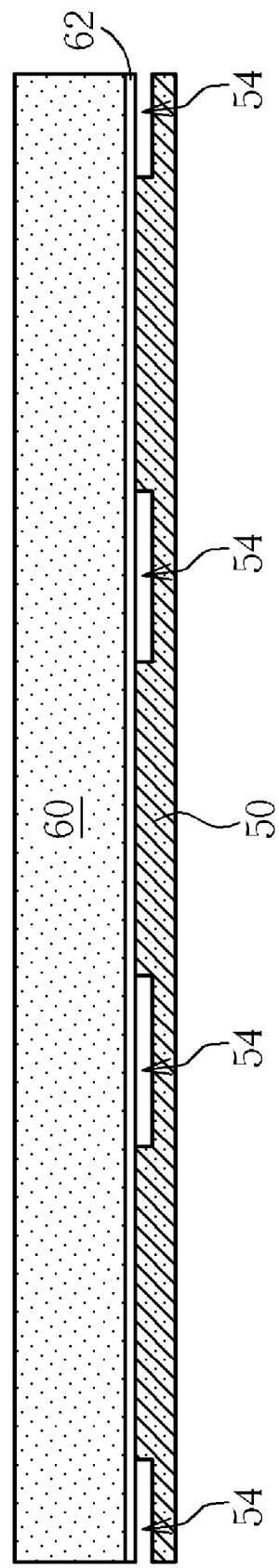
Figure 11:
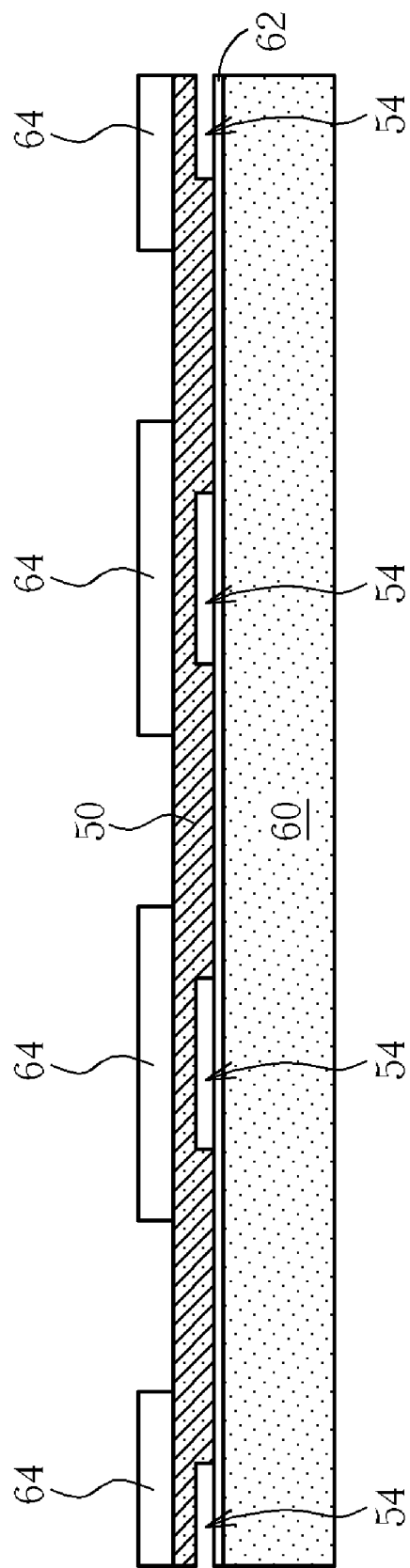
Figure 12:
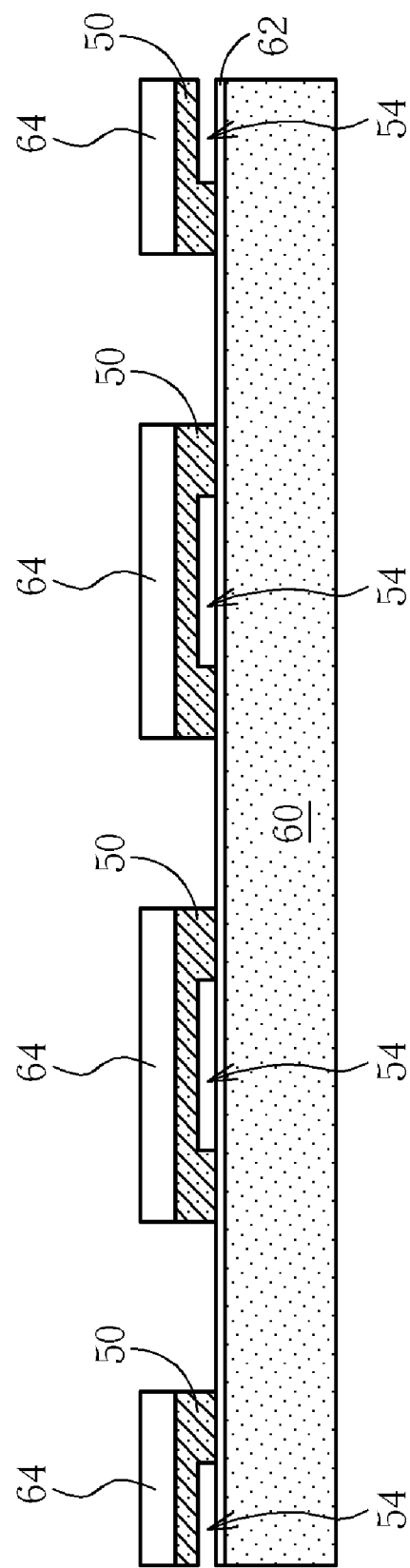

As shown in FIG. 10, a thinning process can be optionally performed to reduce the thickness of the cap wafer 50 to a desired thickness wherever necessary. The thinning process can be a grinding process, a polish process, a CMP process, or an etching process. As shown in FIG. 1, a masking layer is subsequently formed on the second surface of the cap wafer 50. The masking layer includes a plurality of masking patterns 64 corresponding to the cavities 54, and each masking pattern 64 has a size slightly larger than that of each cavity 54. The material of the masking layer can be photoresist or other suitable materials. As shown in FIG. 12, an etching process e.g. an RIE process is performed to etch through the cap wafer 50 not covered by the masking patterns 64. It is appreciated that the bonding layer 62 can also serve as an etching stop layer.

Figure 13:
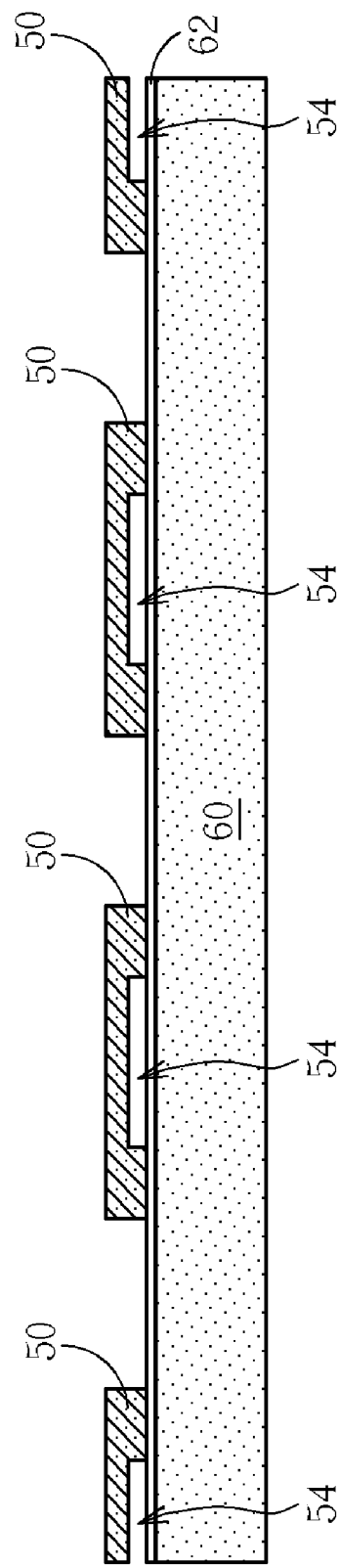
Figure 14:
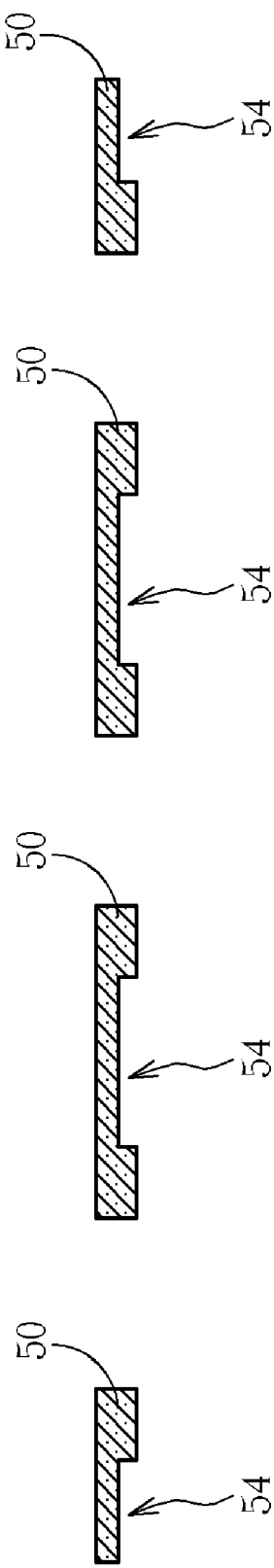
Figure 15:
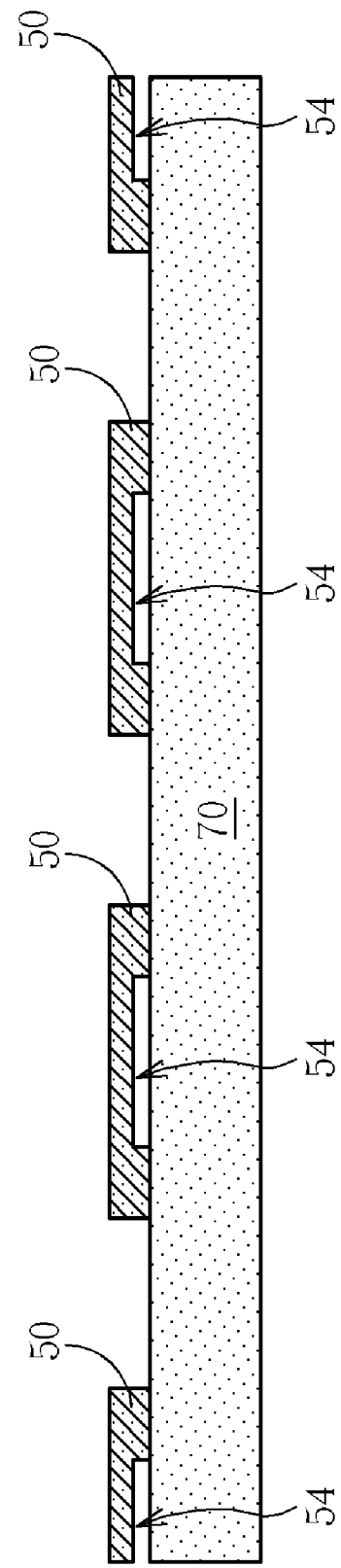

As shown in FIG. 13, the masking patterns 64 are then released from the second surface of the cap wafer 50. As shown in FIG. 14, the bonding layer 62 is removed to release the cap wafer 50 from the support wafer 60. As shown in FIG. 15, the first surface of the cap wafer 50 is adhered to a transparent wafer 70. In this embodiment, the transparent wafer 70 is a glass wafer, and the cap wafer 50 and the transparent wafer 70 are bonded by anodic bonding or fusion bonding. It is appreciated that the cavities 54 of the cap wafer 50 are not in contact with the transparent wafer 70, and thus are not bonded to the transparent wafer 70. The transparent wafer 70 can be made of other materials such as quartz or plastic, and the bonding can be implemented by any possible methods.

Figure 16:
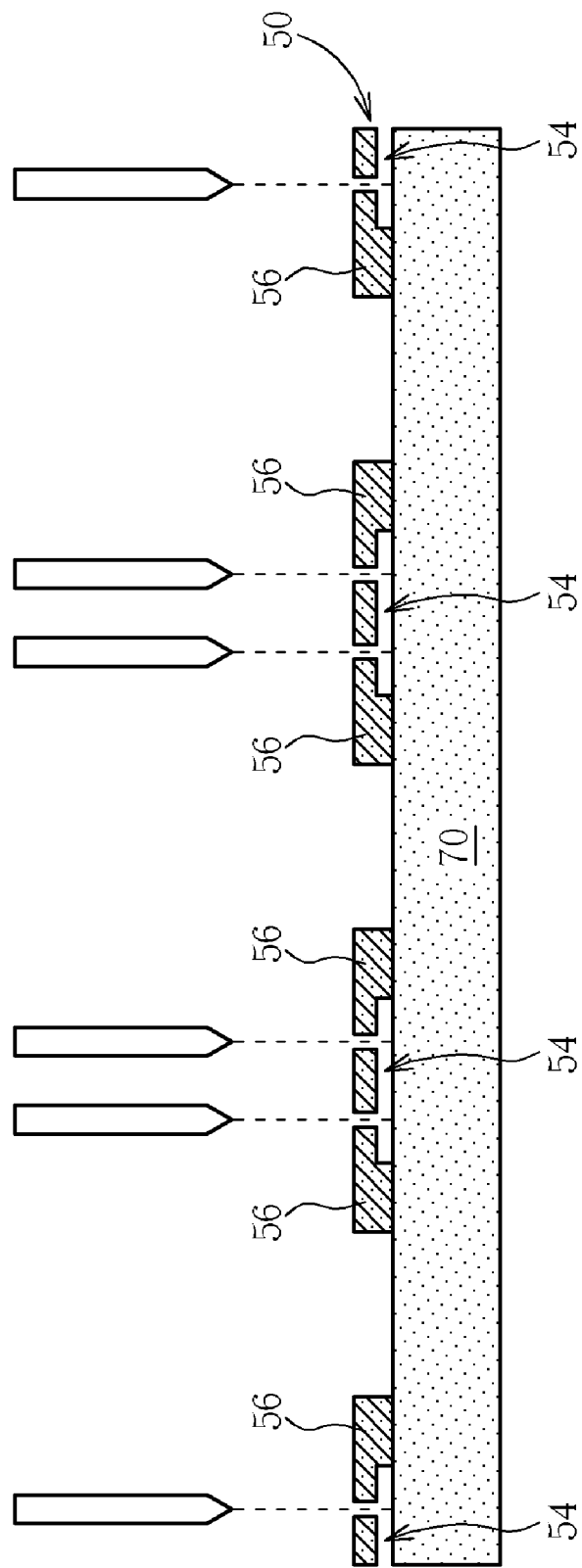

As shown in FIG. 16, the cap wafer 50 corresponding to the cavities 54 are removed so that the remaining cap wafer 50 forms a plurality of support blocks 56. The support blocks 56 and the transparent wafer 70 therefore form cap structures for packaging. In this embodiment, the cap wafer 50 is removed by a cutting process. Since the cavities 54 are not in contact with the transparent wafer 70, the transparent wafer 70 is prevented from being damaged in the cutting process. In addition, the size of the cap wafer 50 being cut is slightly smaller that that of the cavity 54, and therefore the support block 54 has an L-shaped structure. This L-shaped structure is helpful to the cutting process to be performed. Furthermore, the support blocks 56 can also be formed by etching, instead of by cutting.

Figure 17:
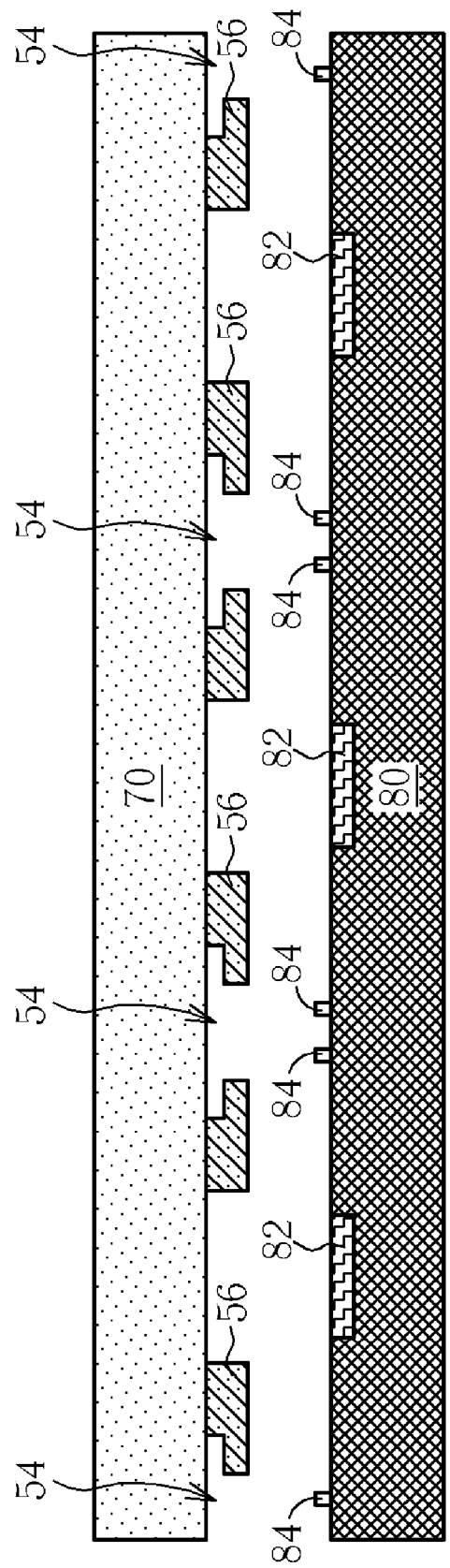
Figure 18:
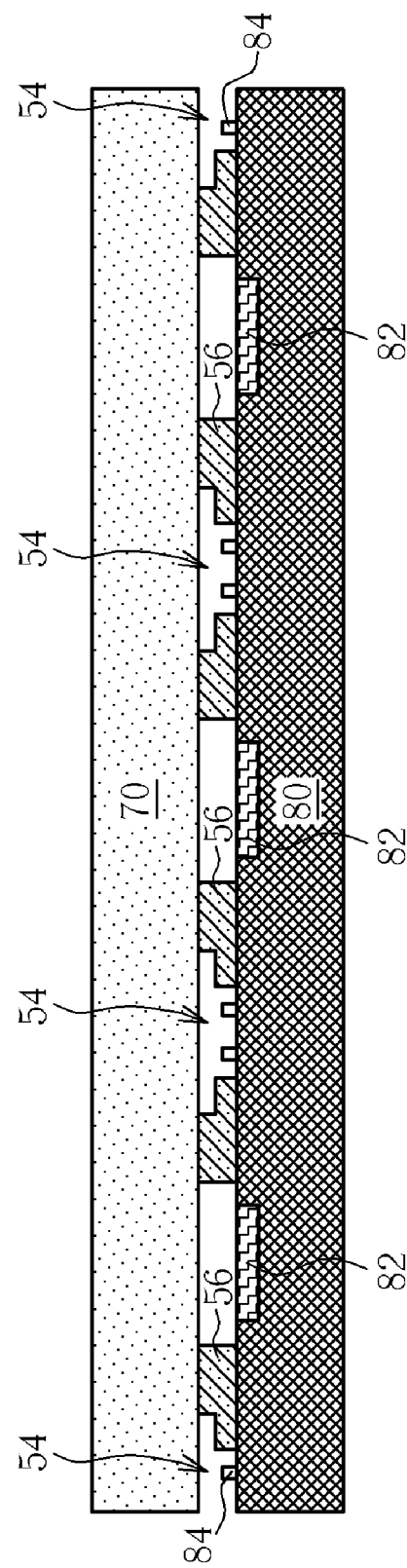

As shown in FIG. 17, a device wafer 80 is provided. The device wafer 80 includes devices 82 such as semiconductor devices, optical devices, or MEMS devices to be packaged, contact pads 84, and inter-connection layers (not shown) disposed therein. The transparent wafer 70 and the device wafer 80 are then aligned to let each device 82 correspond to a place between two adjacent support blocks 80. As shown in FIG. 18, the support blocks 56 and the device wafer 80 are bonded together. Consequently, the support blocks 56 and the transparent wafer 70 form hermetical windows, which seal off the devices 82. In this embodiment, the support blocks 56 and the device wafer 80 are bonded by eutectic bonding or glass frit bonding, but not limited to these two methods.

Figure 19:
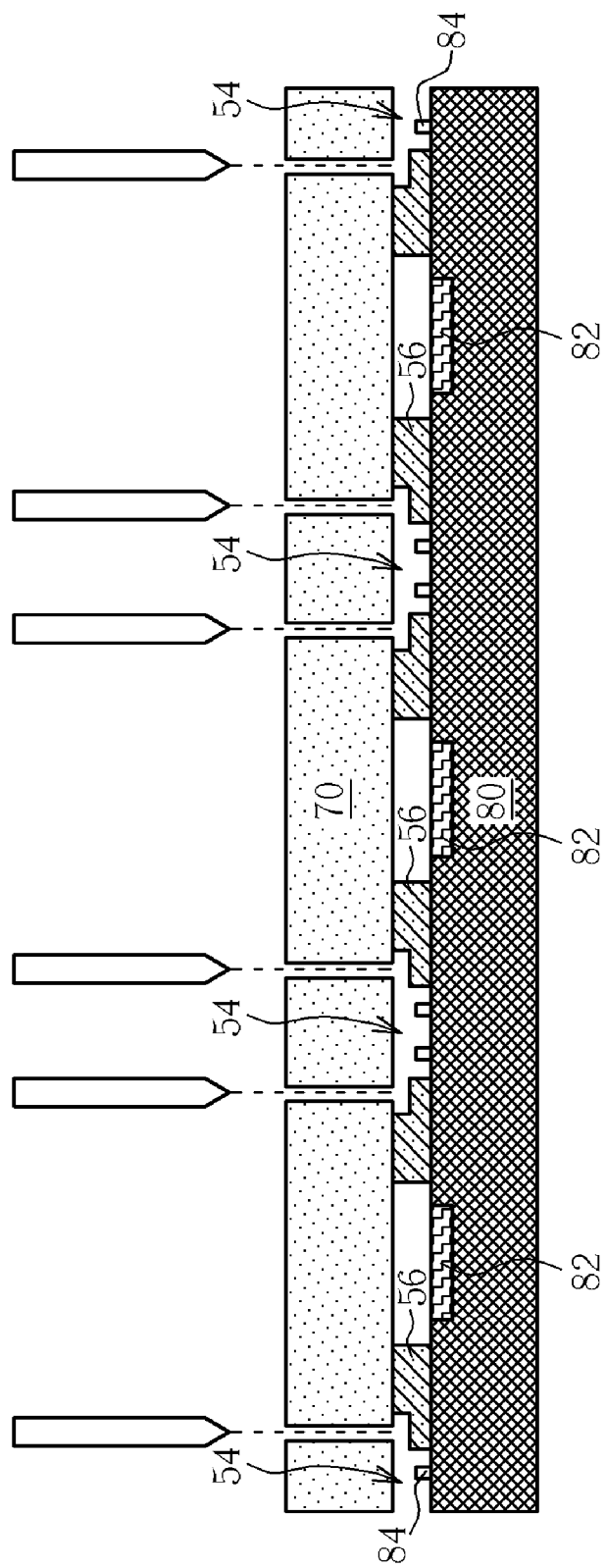
Figure 20:
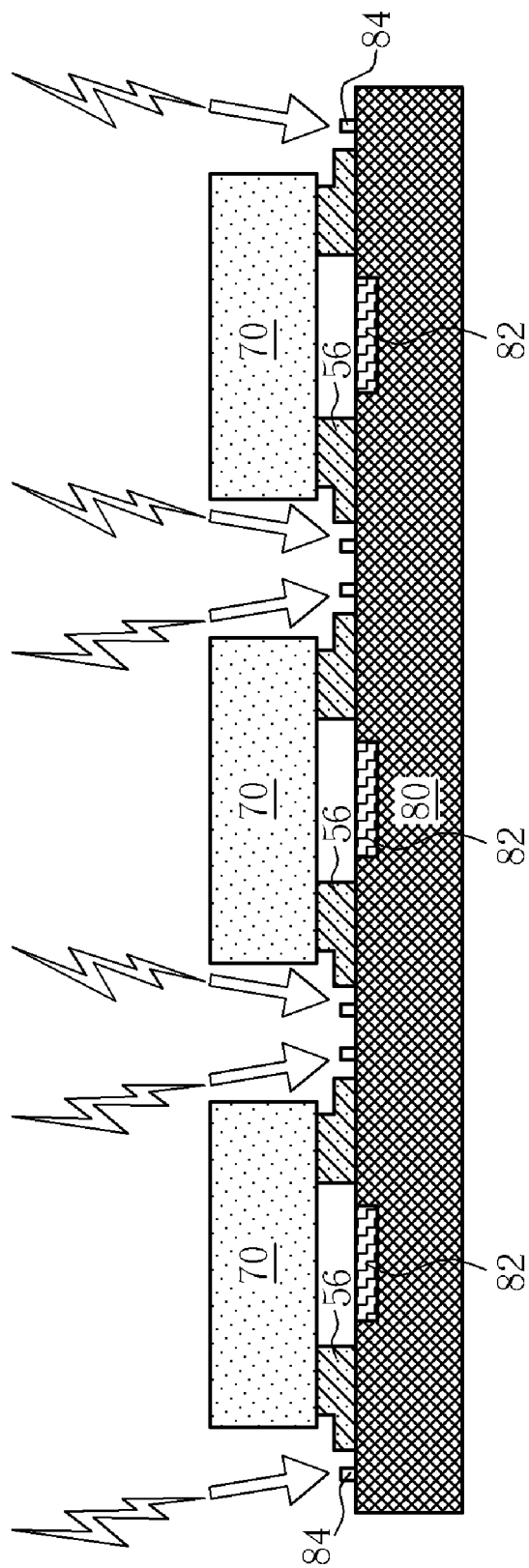

As shown in FIG. 19, a cutting process is performed to cut the transparent wafer 70 corresponding to the contact pads 84 to expose the contact pads 84. As earlier mentioned, the support block 56 has an L-shape structure, and therefore will not be damaged in the cutting process. As shown in FIG. 20, since the devices 82 are not divided, a wafer-level testing can be carried out to test the devices 82 via the exposed contact pads 84.

Figure 21:
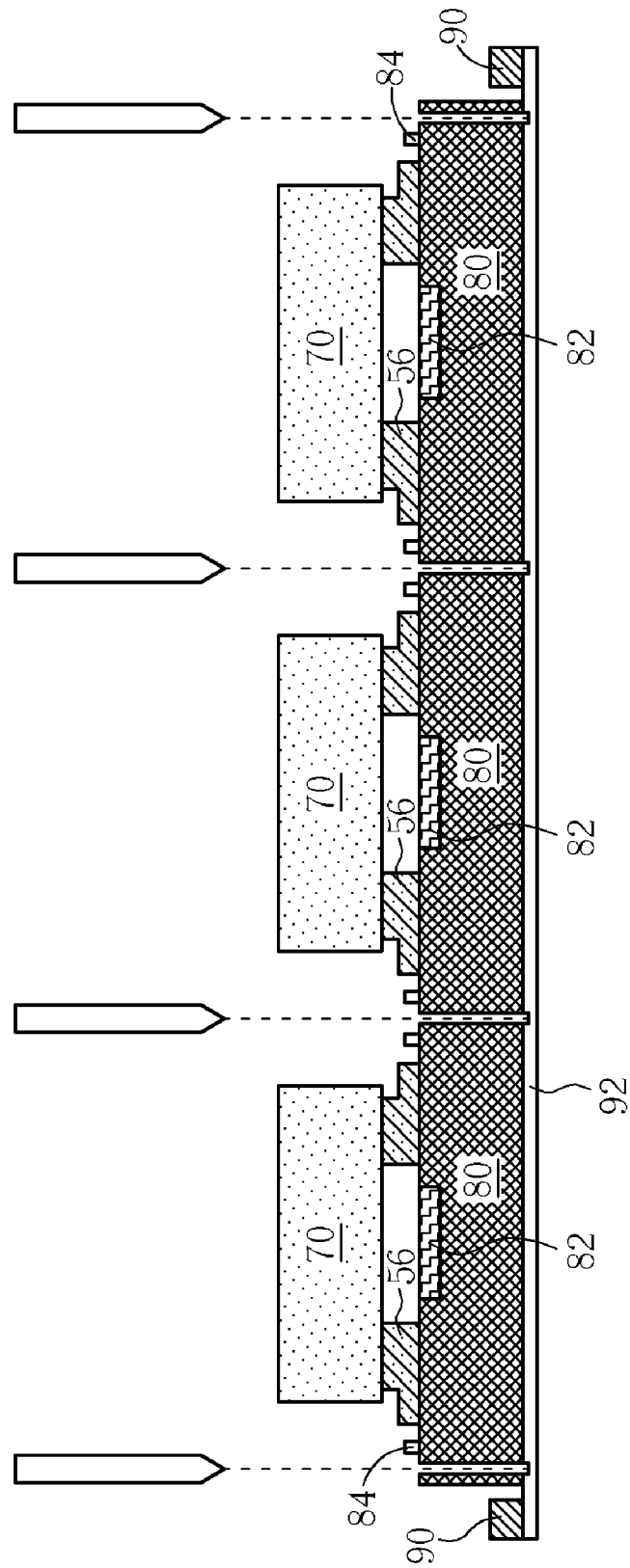
Figure 22:
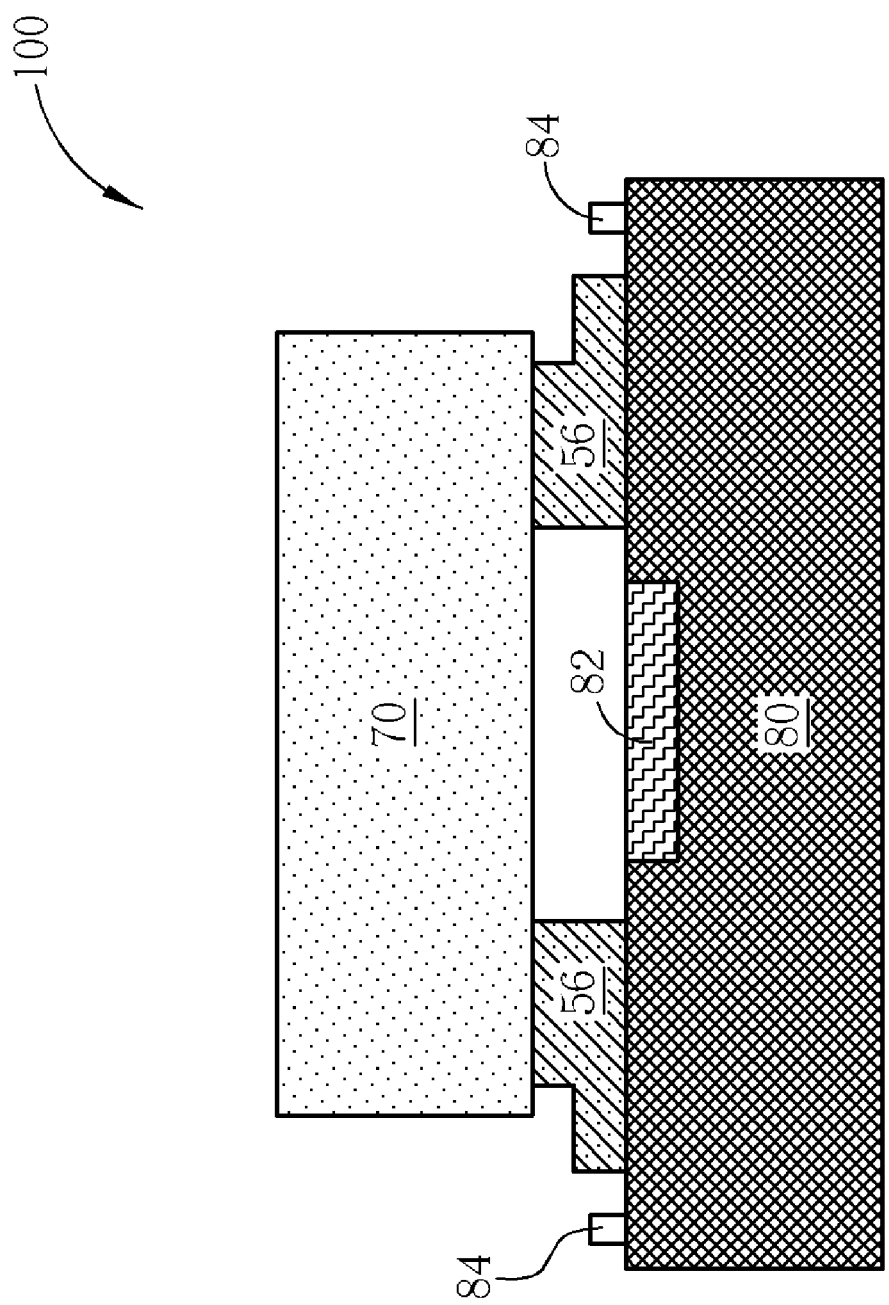

As shown in FIG. 21, a singulation process is subsequently performed. First, a frame 90 having an extendable film 92 mounted thereon is provided. Than, the device wafer 80 is adhered to the extendable film 92, and a cutting process is performed to dice the device wafer 80 along pre-defined scribe lines. Accordingly, the device wafer 80 is divided into a plurality of packaged device structures. Subsequently, an automatic expansion and sorting process is performed by extending the extendable film 92. As shown in FIG. 22, a packaged device structure 100 having a hermetical window is formed after the wafer sorting process.

In summary, the method of the present invention has the advantages of high air-tightness, high yield, and batch production. In addition, the method of the present invention enables a wafer-level testing, and is compatible with semiconductor fabrications.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for wafer-level package, comprising:
   providing a cap wafer;
   forming a plurality of cavities in a first surface of the cap wafer;
   bonding the first surface of the cap wafer to a support wafer;
   etching through a portion of the cap wafer surrounding the cavities from a second surface of the cap wafer;
   removing the cap wafer from the support wafer, and bonding the first surface of the cap wafer to a transparent wafer;
   removing a portion of the cap wafer corresponding to the cavities from the second surface of the cap wafer so that the remaining cap wafer form a plurality of support blocks;
   providing a device wafer comprising a plurality of devices and a plurality of contact pads; and
   bonding the support blocks to the device wafer so that the support blocks and the transparent wafer hermitically seal the devices.

2. The method of claim 1, further comprising removing the transparent wafer corresponding to the contact pads to expose the contact pads subsequent to bonding the support blocks and the device wafer.

3. The method of claim 2, further comprising performing a wafer-level testing via the contact pads.

4. The method of claim 2, further comprising performing a singulation process to form a plurality of packaged device structures subsequent to exposing the contact pads.

5. The method of claim 4, wherein the singulation process comprises:
   providing a frame comprising an extendable film mounted thereon;
   bonding the device wafer to the extendable film;
   performing a cutting process to dice the device wafer along scribe lines of the device wafer; and
   performing an automatic wafer expansion and sorting process.

6. The method of claim 1, wherein the cap wafer comprises a semiconductor wafer.

7. The method of claim 1, wherein the cavities are formed by etching.

8. The method of claim 1, wherein the support wafer comprises a glass wafer, a quartz wafer, a plastic wafer, or a semiconductor wafer.

9. The method of claim 1, wherein the cap wafer is bonded to the support wafer with a bonding layer.

10. The method of claim 1, further comprising performing a thinning process on the cap wafer subsequent to bonding the first surface of the cap wafer to the support wafer.

11. The method of claim 1, wherein the transparent wafer comprises a glass wafer, a quartz wafer, or a plastic wafer.

12. The method of claim 1, wherein the cap wafer and the transparent wafer are bonded together by anodic bonding or fusion bonding.

13. The method of claim 1, wherein each support block has an L-shaped structure.

14. The method of claim 1, wherein the support blocks and the device wafer are bonded together by eutectic bonding or glass frit bonding.

15. The method of claim 1, wherein the devices comprise optical devices, MEMS devices, or semiconductor devices.

* * * * *